United States Patent
Cassia et al.

(10) Patent No.: US 8,022,772 B2
(45) Date of Patent: Sep. 20, 2011

(54) CASCODE AMPLIFIER WITH PROTECTION CIRCUITRY

(75) Inventors: Marco Cassia, San Diego, CA (US); Gurkanwal Singh Sahota, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 12/407,729

(22) Filed: Mar. 19, 2009

(65) Prior Publication Data

US 2010/0237945 A1 Sep. 23, 2010

(51) Int. Cl.
*H03F 1/22* (2006.01)
(52) U.S. Cl. .......................................... 330/311; 330/51
(58) Field of Classification Search .............. 330/51, 330/277, 295, 298, 311
See application file for complete search history.

(56) References Cited

U.S. PATENT DOCUMENTS

| 7,126,427 | B2 * | 10/2006 | Aoki ........................ 330/311 |
| 7,126,428 | B2 * | 10/2006 | Lin et al. ................... 330/311 |
| 7,276,976 | B2 * | 10/2007 | Oh et al. .................... 330/311 |
| 7,486,135 | B2 * | 2/2009 | Mu .............................. 330/51 |
| 2006/0119435 | A1 | 6/2006 | Oh et al. |
| 2007/0052474 | A1 | 3/2007 | Saito |
| 2008/0272825 | A1 | 11/2008 | Miyada |
| 2008/0309413 | A1 | 12/2008 | Igarashi et al. |
| 2010/0141337 | A1 * | 6/2010 | Chen ........................ 330/124 R |

FOREIGN PATENT DOCUMENTS

DE 102004056435 6/2006
WO WO2008145604 A1 12/2008

OTHER PUBLICATIONS

International Search Report and Written Opinion—PCT/US2010/027868, International Search Authority—European Patent Office—Jul. 12, 2010.

* cited by examiner

*Primary Examiner* — Khanh Nguyen
(74) *Attorney, Agent, or Firm* — Jiayu Xu; Eric Ho

(57) ABSTRACT

A cascode amplifier with protection circuitry is described. In one exemplary design, the amplifier includes multiple branches coupled in parallel, with at least one branch being switchable between "on" and "off" states. Each switchable branch includes a gain transistor coupled to a cascode transistor. The gain transistor amplifies an input signal and provides an amplified signal in the on state and does not amplify the input signal in the off state. The cascode transistor buffers the amplified signal and provides an output signal in the on state. The output signal swing may be split between the gain transistor and the cascode transistor in both the on and off states with the protection circuitry. Each transistor may then observe a fraction of the voltage swing. The voltage splitting in the off state may be achieved by floating the gain transistor and shorting the gate and source of the cascode transistor.

36 Claims, 6 Drawing Sheets

CASCODE AMPLIFIER WITH PROTECTION CIRCUITRY

BACKGROUND

I. Field

The present disclosure relates generally to electronics, and more specifically to an amplifier.

II. Background

Amplifiers are commonly used in various electronics devices to provide signal amplification. Different types of amplifiers are available for different uses. For example, a wireless communication device such as a cellular phone may include a transmitter and a receiver for bi-directional communication. The transmitter may utilize a driver amplifier (DA) and a power amplifier (PA), the receiver may utilize a low noise amplifier (LNA), and the transmitter and receiver may utilize variable gain amplifiers (VGAs).

Sub-micron complementary metal oxide semiconductor (CMOS) fabrication processes are commonly used for radio frequency (RF) circuits in wireless devices and other electronics devices in order to reduce cost and improve integration. As CMOS device size continues to shrink, sub-micron transistors are more and more susceptible to stress under large signal swing conditions. The stress may adversely impact the reliability of amplifiers implemented with these sub-micron transistors. An amplifier with good performance and good reliability is highly desirable.

SUMMARY

A cascode amplifier with protection circuitry, which can be fabricated in sub-micron CMOS and having good reliability, is described herein. In one exemplary design, the amplifier includes multiple branches coupled in parallel, with the multiple branches including at least one switchable branch. Each switchable branch may be operated in either an "on" state to increase an overall gain of the amplifier or an "off" state to decrease the overall gain. Each switchable branch may include a gain transistor coupled to a cascode transistor. The gain transistor may amplify the input signal and provide an amplified signal in the on state and may not amplify an input signal in the off state. The cascode transistor may buffer the amplified signal and provide an output signal in the on state.

An inductor may be coupled between a power supply voltage and the drain of the cascode transistor in each branch. The output signal may then have voltage swing below and above the supply voltage. A bias circuit may receive the output signal and provide a bias voltage for the cascode transistor in each branch.

For each switchable branch, the voltage swing of the output signal may be split between the gain transistor and the cascode transistor in the on state as well as the off state with the protection circuitry. Each transistor may then observe a fraction of the output voltage swing in both the on and off states, which may reduce stress and improve reliability. In one exemplary design, the voltage splitting in the off state may be achieved by opening/floating the gain transistor and shorting the gate and source of the cascode transistor. The gain transistor may be opened by (i) decoupling the source of the gain transistor from circuit ground or (ii) shorting the gate of the gain transistor to circuit ground and disconnecting the gate from the input signal.

Various aspects and features of the disclosure are described in further detail below.

DETAILED DESCRIPTION

The word "exemplary" is used herein to mean "serving as an example, instance, or illustration." Any design described herein as "exemplary" is not necessarily to be construed as preferred or advantageous over other designs.

The cascode amplifier with protection circuitry described herein may be used for various electronics devices such as wireless communication devices, cellular phones, personal digital assistants (PDAs), handheld devices, wireless modems, laptop computers, cordless phones, broadcast receivers, Bluetooth devices, consumer electronics devices, etc. For clarity, the use of the cascode amplifier in a wireless device, which may be a cellular phone or some other device, is described below.

Figure 1:
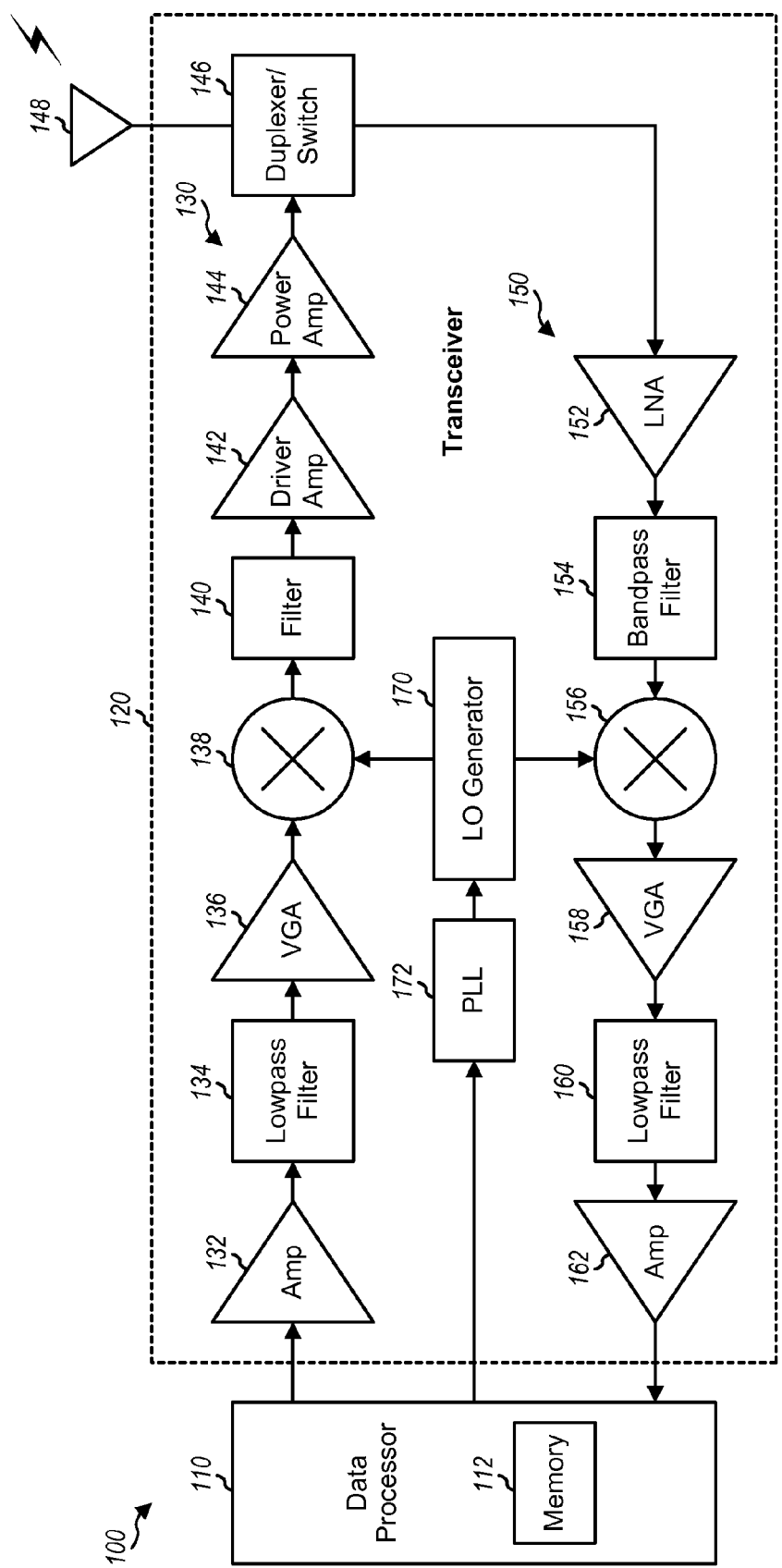
FIG. 1 shows a block diagram of a wireless communication device.

FIG. 1 shows a block diagram of an exemplary design of a wireless communication device 100. In this exemplary design, wireless device 100 includes a data processor 110 and a transceiver 120. Transceiver 120 includes a transmitter 130 and a receiver 150 that support bi-directional wireless communication. In general, wireless device 100 may include any number of transmitters and any number of receivers for any number of communication systems and any number of frequency bands.

In the transmit path, data processor 110 processes data to be transmitted and provides an analog output signal to transmitter 130. Within transmitter 130, the analog output signal is amplified by an amplifier (Amp) 132, filtered by a lowpass filter 134 to remove undesired images caused by prior digital-to-analog conversion, amplified by a variable gain amplifier (VGA) 136, and upconverted from baseband to RF by an upconverter 138. The upconverted signal is filtered by a filter 140 to remove undesired images caused by the frequency upconversion, further amplified by a driver amplifier (DA) 142 and a power amplifier (PA) 144, routed through a duplexer/switch 146, and transmitted via an antenna 148.

In the receive path, antenna 148 receives signals from base stations and provides a received RF signal, which is routed through duplexer/switch 146 and provided to receiver 150. Within receiver 150, the received RF signal is amplified by a low noise amplifier (LNA) 152, filtered by a bandpass filter 154, and downconverted from RF to baseband by a downconverter 156. The downconverted signal is amplified by a VGA 158, filtered by a lowpass filter 160, and amplified by an amplifier 162 to obtain an analog input signal, which is provided to data processor 110.

FIG. 1 shows transmitter 130 and receiver 150 implementing a direct-conversion architecture, which frequency converts a signal between RF and baseband in one stage. Transmitter 130 and/or receiver 150 may also implement a super-heterodyne architecture, which frequency converts a signal between RF and baseband in multiple stages. A local oscillator (LO) generator 170 generates and provides transmit and receive LO signals to upconverter 138 and downconverter 156, respectively. A phase locked loop (PLL) 172 may receive control information from data processor 110 and provide control signals to LO generator 170 to generate the transmit and receive LO signals at the proper frequencies.

FIG. 1 shows an exemplary transceiver design. In general, the conditioning of the signals in transmitter 130 and receiver 150 may be performed by one or more stages of amplifier, filter, mixer, etc. These circuit blocks may be arranged differently from the configuration shown in FIG. 1. Furthermore, other circuit blocks not shown in FIG. 1 may also be used to condition the signals in the transmitter and receiver. Some circuit blocks in FIG. 1 may also be omitted. All or a portion of transceiver 120 may be implemented on an analog integrated circuit (IC), an RF IC (RFIC), a mixed-signal IC, etc. For example, amplifier 132 through driver amplifier 142 may be implemented on an RFIC whereas power amplifier 144 may be implemented external to the RFIC.

Data processor 110 may perform various functions for wireless device 100, e.g., digitally processing for transmitted and received data. A memory 112 may store program codes and data for data processor 110. Data processor 110 may be implemented on one or more application specific integrated circuits (ASICs) and/or other ICs.

As shown in FIG. 1, a transmitter and a receiver may include various amplifiers. Each amplifier may be implemented with various designs.

Figure 2:
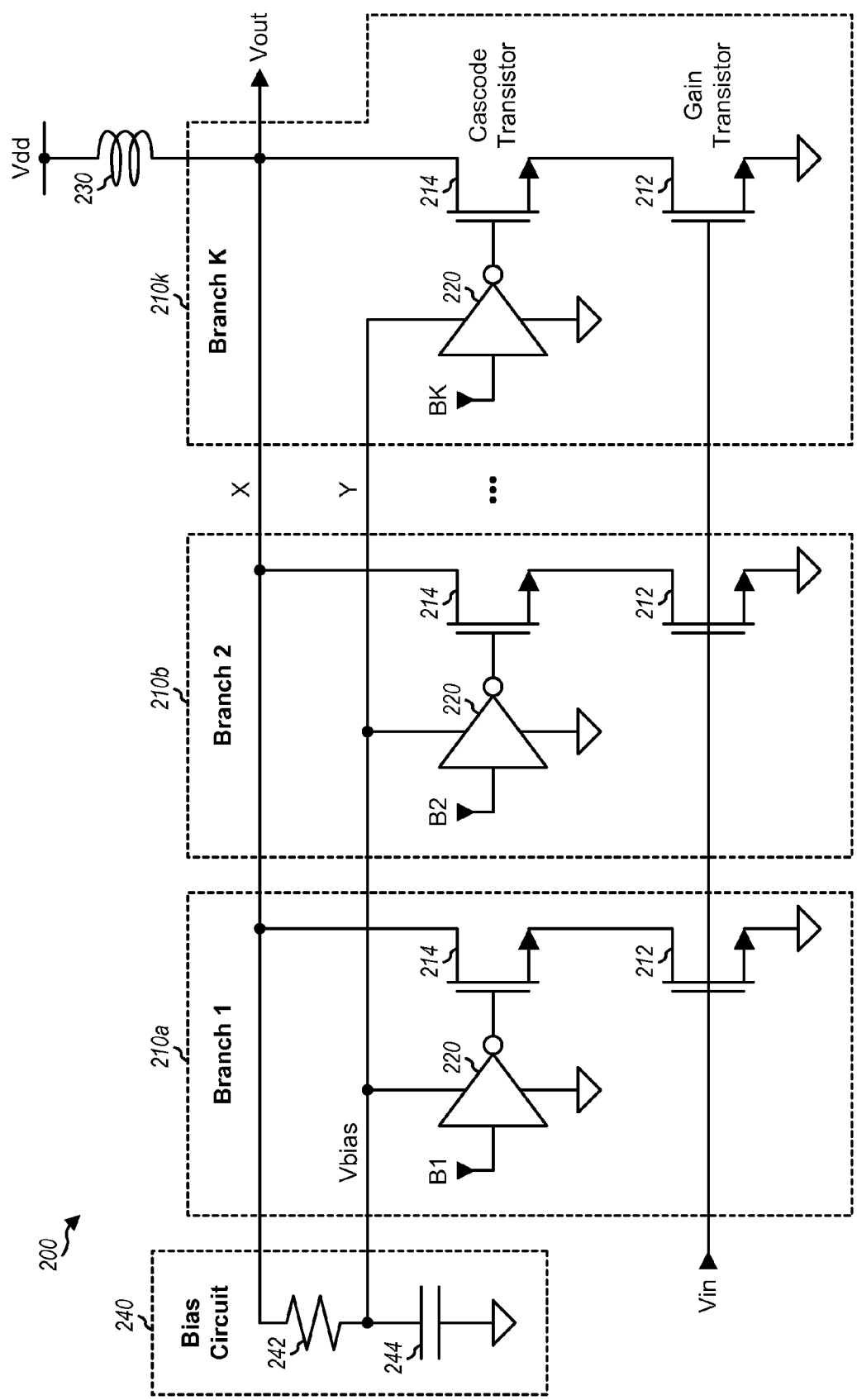
FIG. 2 shows a schematic diagram of a cascode amplifier.

FIG. 2 shows a schematic diagram of a cascode amplifier 200. Amplifier 200 may be used for DA 142, PA 144, LNA 152, VGAs 136 and 158, and/or other amplifiers in FIG. 1. Amplifier 200 includes K branches 210a through 210k coupled in parallel, where K may be any integer value. The branches may also be referred to as amplifier stages, etc. Within each branch 210, an N-channel metal oxide semiconductor (NMOS) transistor 212 has its source coupled to circuit ground and its gate receiving an input signal, Vin. The terms "transistor" and "device" are often used interchangeably. An NMOS transistor 214 has its source coupled to the drain of NMOS transistor 212, its gate coupled to the output of an inverter 220, and its drain coupled to node X, which provides an output signal, Vout. NMOS transistor 212 is a gain transistor that receives the Vin signal at its gate, amplifies the Vin signal, and provides an amplified signal at its drain. NMOS transistor 212 is also referred to as a common source transistor, a $g_m$ transistor, etc. NMOS transistor 214 is a cascode transistor that has its gate coupled to AC ground, receives the amplified signal at its source, and provides the Vout signal at its drain.

Inverter 220 may be implemented with a P-channel MOS (PMOS) transistor and an NMOS transistor having their gates coupled together and forming an inverter input and their drains coupled together and forming an inverter output. The source of the PMOS transistor may be coupled to node Y, and the source of the NMOS transistor may be coupled to circuit ground.

An inductor 230 is coupled between node X and a power supply, Vdd. Inductor 230 provides bias current for NMOS transistors 212 and 214 in all enabled branches. Inductor 230 may also be used for output impedance matching. A bias circuit 240 receives the Vout signal and generates a bias voltage, Vbias. In the design shown in FIG. 2, bias circuit 240 is implemented with a resistor 242 and a capacitor 244 that form a lowpass filter. Resistor 242 is coupled between nodes X and Y, and capacitor 244 is coupled between node Y and circuit ground. Node Y provides the Vbias voltage. Bias circuit 240 may also be implemented with other designs, e.g., with capacitive feedback.

Each of the K branches 210a through 210k may be individually enabled or disabled via a respective Bk control signal, where k∈{1, ..., K}. For the k-th branch, when the Bk control signal is at logic low, the output of inverter 220 is at logic high, NMOS transistor 214 is turned on, and the branch is enabled. Conversely, when the Bk control signal is at logic high, the output of inverter 220 is at logic low, NMOS transistor 214 is turned off, and the branch is disabled. Each branch provides signal gain when enabled. The K branches 210a through 210k may provide equal amount of gain (e.g., with the same transistor sizes for all K branches) or may provide different amounts of gain (e.g., with different transistor sizes for the K branches). For example, NMOS transistors 212 and 214 in branch 1 may be twice the size (and gain) of NMOS transistors 212 and 214 in branch 2, which may be twice the size of NMOS transistors 212 and 214 in the next branch, etc. The desired overall gain for amplifier 200 may be obtained by enabling the proper branch(es). The output signal swing may be dependent on (e.g., may be proportional to) the overall gain of amplifier 200.

Cascode amplifier 200 operates as follows. For each branch that is enabled, NMOS transistor 212 amplifies the Vin signal and provides an amplified signal. NMOS transistor 212 also performs voltage-to-current conversion. NMOS transistor 214 buffers the amplified signal and provides signal drive for the Vout signal.

Cascode amplifier 200 is implemented with an open drain architecture, and the Vout signal can swing below and above Vdd. Output voltage swing above Vdd is possible because of inductor 230. When the Vout signal is above Vdd, cascode transistors 214 in all K branches 210 may observe a large voltage, which may stress these transistors. Feedback may be used to reduce the voltage swing across cascode transistors 214. In FIG. 2, feedback is implemented with resistor 242 and capacitor 244, which form a lowpass filter having a bandwidth that is much lower than the frequency of the Vout signal. The lowpass filter provides an attenuated version of the Vout signal as the Vbias voltage. For each branch 210 that is enabled, the Vbias voltage is provided via inverter 220 to the gate of cascode transistor 214. In this way, the voltage swing at output node X may be split across cascode transistor 214 and gain transistor 212 in each enabled branch 210.

For each branch 210, the feedback limits the voltage swing across cascode transistor 214 when it is turned on. However, most of the stress occurs when cascode transistor 214 is turned off. In the off state, the gate of cascode transistor 214 is pulled to ground via inverter 220, and the source of cascode transistor 214 is also pulled to ground via gain transistor 212, which operates as a switch. In the off state, the drain-to-source voltage, Vds, as well as the gate-to-drain voltage, Vgd, of cascode transistor 214 may be larger than Vdd (e.g., up to twice Vdd) and may exceed the rated device voltages. The large Vds and Vgd voltages may stress cascode transistor 214 and may adversely affect the reliability and lifetime of the transistor. The stress may be especially severe when amplifier 200 is operating at high gain/high output power and a branch is disabled to reduce the gain. The cascode transistor in this disabled branch may observe large Vds and Vgd voltages, which may be well above Vdd.

The reliability of cascode transistors 214 in amplifier 200 may be improved by using NMOS transistors with longer gate length or using thick oxide NMOS transistors for cascode transistors 214. However, both solutions may adversely impact the RF performance of the amplifier due to higher capacitance of these NMOS transistors. The higher capacitance may be an issue especially for high frequency operation.

Figure 3:
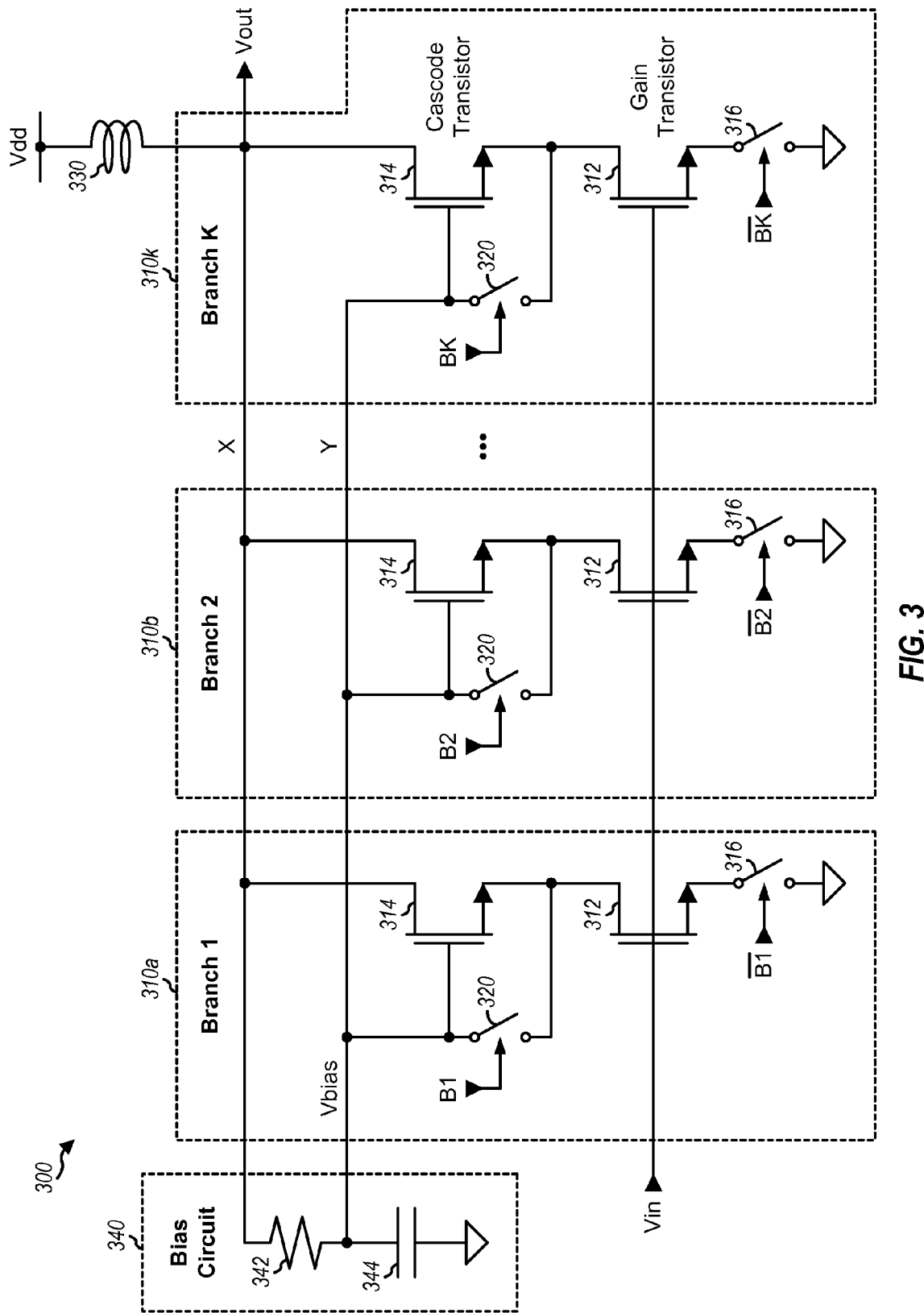
FIGS. 3 and 4 show two exemplary designs of a cascode amplifier with protection circuitry.

FIG. 3 shows a schematic diagram of an exemplary design of a cascode amplifier 300 with protection circuitry. Amplifier 300 may be used for DA 142, PA 144, LNA 152, VGAs 136 and 158, and/or other amplifiers in FIG. 1. Amplifier 300 includes K branches 310a through 310k coupled in parallel. Within each branch 310, an NMOS transistor 312 has its source coupled to one end of a switch 316 and its gate receiving a Vin signal. The other end of switch 316 is coupled to circuit ground. An NMOS transistor 314 has its source coupled to the drain of NMOS transistor 312, its gate coupled to node Y, and its drain coupled to node X. A switch 320 is coupled between the gate and source of NMOS transistor 314 and is controlled by a Bk control signal, where k∈{1, ..., K}. Switch 316 is controlled by a $\overline{Bk}$ control signal, which is complementary of the Bk control signal. Switches 316 and 320 may each be implemented with an NMOS transistor, a PMOS transistor, a transmission gate, etc.

An inductor 330 is coupled between the Vdd power supply and node X, which provides a Vout signal. A bias circuit 340 is implemented with a resistor 342 coupled between nodes X and Y and capacitor 344 coupled between node Y and circuit ground. Node Y provides a Vbias voltage.

Each of the K branches 310a through 310k may be individually enabled or disabled via the Bk and $\overline{Bk}$ control signals for that branch. The k-th branch may be enabled by (i) providing logic low on the Bk control signal, which opens switch 320, and (ii) providing logic high on the $\overline{Bk}$ control signal, which closes switch 316. Conversely, the k-th branch may be disabled by providing logic high on the Bk control signal and logic low on the $\overline{Bk}$ control signal.

Cascode amplifier 300 operates as follows. For each branch that is enabled, NMOS transistor 312 has its source coupled to circuit ground and operates as a gain transistor that amplifies the Vin signal. NMOS transistor 314 has its source disconnected from its gate and operates as a cascode transistor that buffers the amplified signal from NMOS transistor 312 and provides signal drive for the Vout signal. For each branch that is disabled, NMOS transistor 312 has its source decoupled from circuit ground and floats. NMOS transistor 314 has its source connected to its gate, and both receive the Vbias voltage. The output voltage swing is thus split across cascode transistor 314 and gain transistor 312 when the branch is enabled in the on state as well as when the branch is disabled in the off state.

Figure 4:
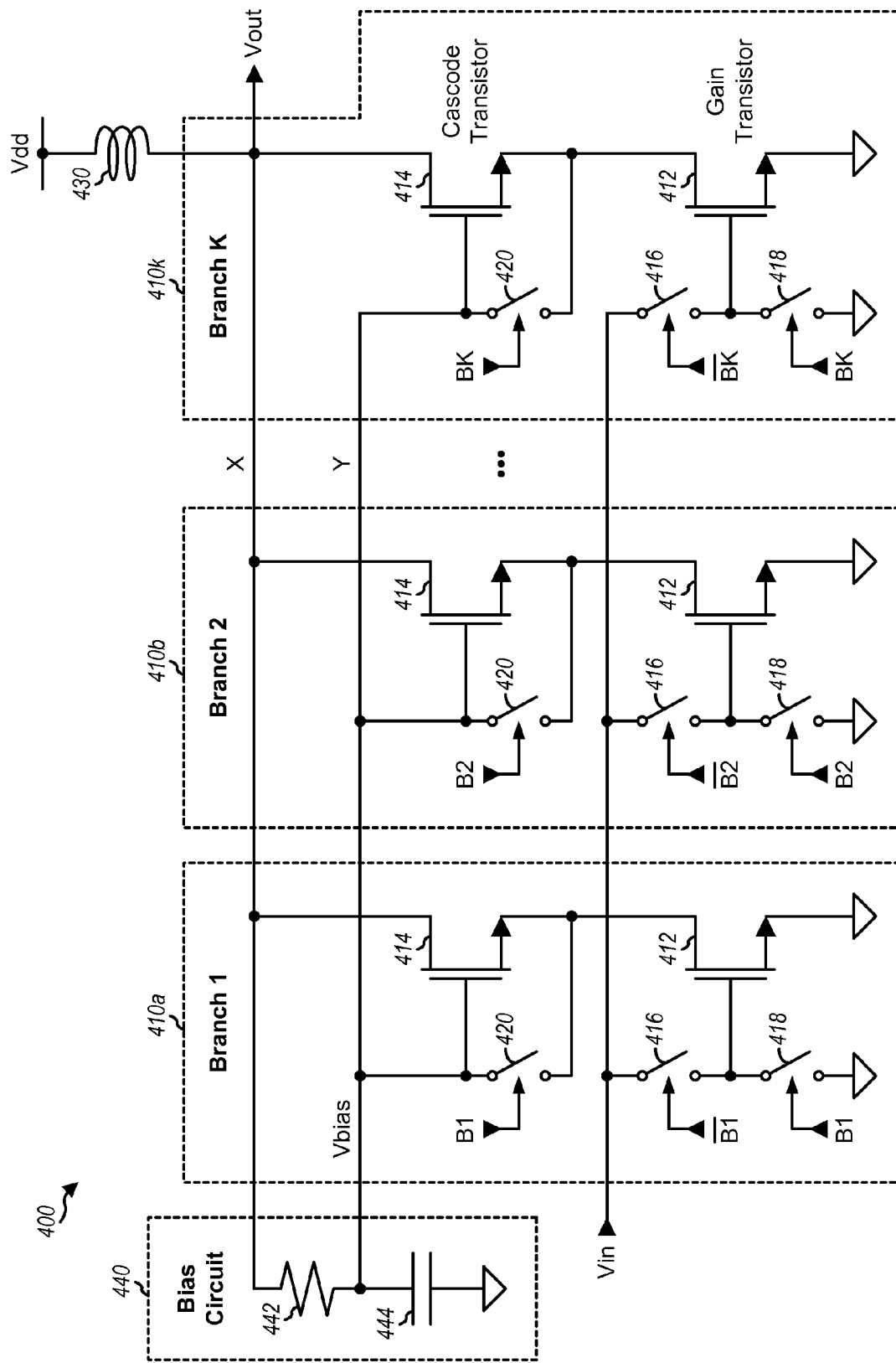

FIG. 4 shows a schematic diagram of an exemplary design of a cascode amplifier 400 with protection circuitry. Amplifier 400 may also be used for DA 142, PA 144, LNA 152, VGAs 136 and 158, and/or other amplifiers in FIG. 1. Amplifier 400 includes K branches 410a through 410k coupled in parallel. Within each branch 410, an NMOS transistor 412 has its source coupled to circuit ground and its gate coupled to one end of a switch 416. The other end of switch 416 receives a Vin signal. A switch 418 is coupled between the gate of NMOS transistor 412 and circuit ground. An NMOS transistor 414 has its source coupled to the drain of NMOS transistor 412, its gate coupled to node Y, and its drain coupled to node X. A switch 420 is coupled between the gate and source of NMOS transistor 414. Switches 418 and 420 are controlled by a Bk control signal, where k∈{1, ..., K}. Switch 416 is controlled by a $\overline{Bk}$ control signal, which is complementary of the Bk control signal. Switches 416, 418 and 420 may each be implemented with an NMOS transistor, a PMOS transistor, a transmission gate, etc. An inductor 430, a bias circuit 440, a resistor 442, and a capacitor 444 are coupled in similar manner as inductor 330, bias circuit 340, resistor 342 and capacitor 344, respectively, in FIG. 3.

Each of the K branches 410a through 410k may be enabled or disabled via the Bk and $\overline{Bk}$ control signals for that branch. The k-th branch may be enabled by (i) providing logic low on the Bk control signal, which opens switches 418 and 420, and (ii) providing logic high on the $\overline{Bk}$ control signal, which closes switch 416. Conversely, the k-th branch may be disabled by providing logic high on the Bk control signal and logic low on the $\overline{Bk}$ control signal.

Cascode amplifier 400 operates as follows. For each branch that is enabled, NMOS transistor 412 has its gate receiving the Vin signal and operates as a gain transistor. NMOS transistor 414 has its source disconnected from its gate and operates as a cascode transistor. For each branch that is disabled, NMOS transistor 412 has its gate disconnected from the Vin signal and coupled to circuit ground. NMOS transistor 414 has its source connected to its gate, and both receive the Vbias voltage. The output voltage swing is thus split across cascode transistors 414 and gain transistors 412 when the branch is enabled as well as when the branch is disabled.

FIGS. 3 and 4 show two exemplary designs of cascode amplifiers having one cascode transistor in each branch. Multiple cascode transistors may also be used in each branch in order to further split the output voltage switch across each transistor.

Figure 5:
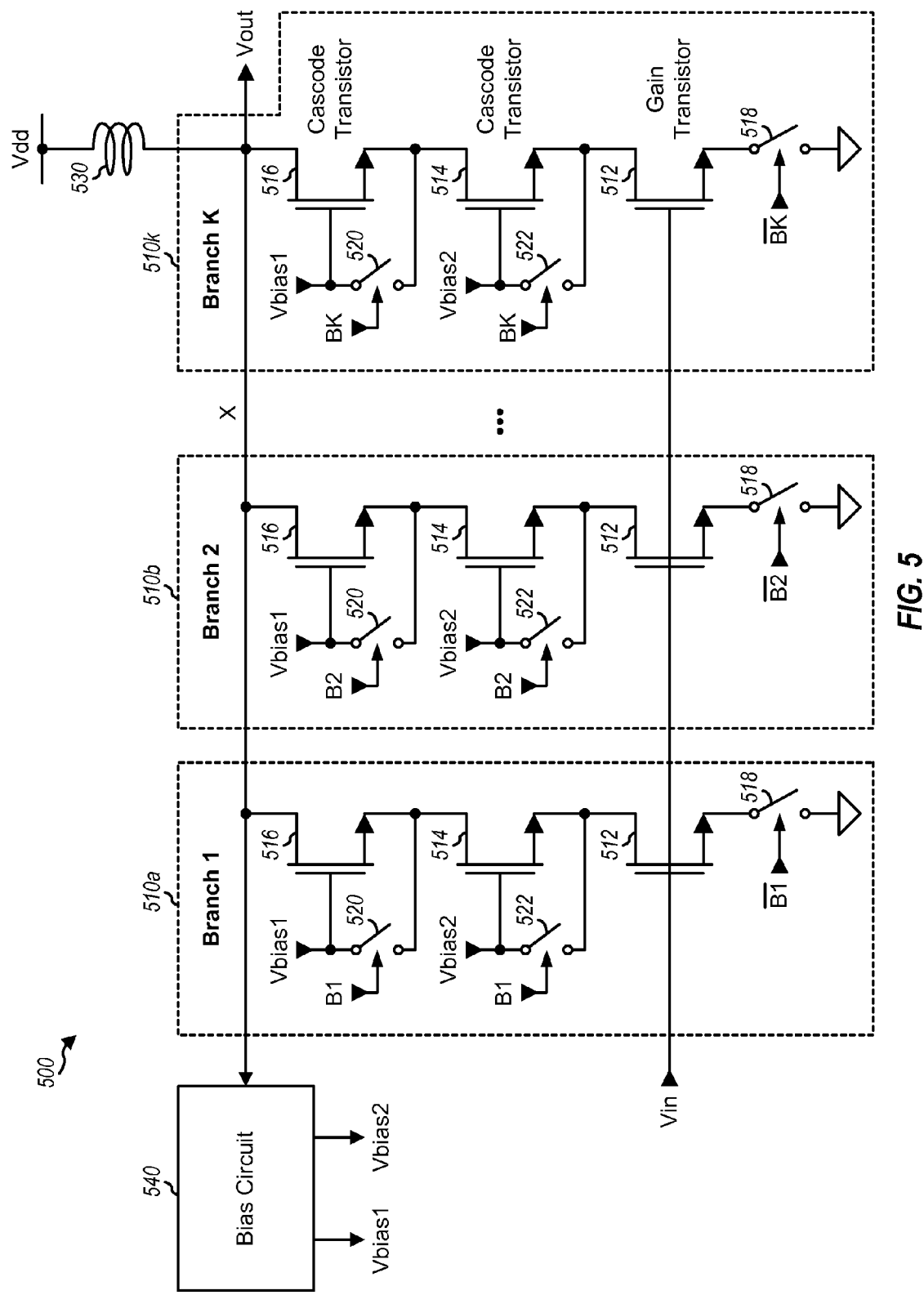
FIG. 5 shows an exemplary design of a cascode amplifier with stacked cascode transistors and protection circuitry.

FIG. 5 shows a schematic diagram of an exemplary design of a cascode amplifier 500 with stacked cascode transistors and protection circuitry. Amplifier 500 may also be used for DA 142, PA 144, LNA 152, VGAs 136 and 158, and/or other amplifiers in FIG. 1. Amplifier 500 includes K branches 510a through 510k coupled in parallel. Within each branch 510, an NMOS transistor 512 has its source coupled to one end of a switch 518 and its gate receiving a Vin signal. The other end of switch 518 is coupled to circuit ground. Two NMOS transistors 514 and 516 are stacked together. NMOS transistor 516 has its drain coupled to node X, its gate receiving a Vbias1 voltage, and its source coupled to the drain of NMOS transistor 514. NMOS transistor 514 has its gate receiving a Vbias2 voltage and its source coupled to the drain of NMOS transistor 512. A switch 520 is coupled between the gate and source of NMOS transistor 516. A switch 522 is coupled between the gate and source of NMOS transistor 514. Switches 520 and 522 are controlled by a Bk control signal, where k∈{1, ..., K}. Switch 518 is controlled by a $\overline{Bk}$ control signal, which is complementary of the Bk control signal. Switches 518, 520 and 522 may each be implemented with an NMOS transistor, a PMOS transistor, a transmission gate, etc. An inductor 530 is coupled between the Vdd supply voltage and node X, which provides a Vout signal.

A bias circuit 540 receives the Vout signal and generates the Vbias1 and Vbias2 voltages for cascode transistors 516 and 514, respectively, in each branch 510. The Vbias1 and Vbias2 voltages may be generated to split the output voltage swing across cascode transistors 514 and 516. In one exemplary design, Vbias1≈$\overline{Vout}$ and Vbias2≈2 $\overline{Vout}$/3, where $\overline{Vout}$ is a filtered version of the Vout signal. In this exemplary design, the output voltage swing may be distributed approximately evenly across the three transistors in each branch.

Each of the K branches 510a through 510k may be individually enabled or disabled via the Bk and $\overline{Bk}$ control signals for that branch. The k-th branch may be enabled by (i) providing logic low on the Bk control signal, which opens switches 520 and 522, and (ii) providing logic high on the $\overline{Bk}$ control signal, which closes switch 518. Conversely, the k-th branch may be disabled by providing logic high on the Bk control signal and logic low on the $\overline{Bk}$ control signal.

Cascode amplifier 500 operates as follows. For each branch that is enabled, NMOS transistor 512 has its source coupled to circuit ground and operates as a gain transistor. NMOS transistors 514 and 516 have their sources disconnected from their gates and operate as cascode transistors. For each branch that is disabled, NMOS transistor 512 has its source decoupled from circuit ground and floats. NMOS transistor 516 has its source connected to its gate, which receives the Vbias1 voltage. NMOS transistor 514 has its source connected to its gate, which receives the Vbias2 voltage. The output voltage swing is thus split across cascode transistors 514 and 516 and gain transistor 512 when the branch is enabled as well as when the branch is disabled.

FIG. 5 shows an exemplary design of a cascode amplifier with two stacked cascode transistors. More than two cascode transistors may also be stacked. A suitable bias voltage may be provided to the gate of each cascode transistor to obtain the desired Vds and Vgd voltage swing across that cascode transistor in both the on and off states.

FIGS. 3, 4 and 5 show three exemplary designs of protection circuitry for a cascode amplifier. The protection circuitry may also be implemented with other designs. In general, the protection circuitry may keep the feedback active even when a branch is disabled. This may be achieved by opening/floating the gain transistor via (i) a series switch coupled at the source of the gain transistor, e.g., as shown in FIGS. 3 and 5, or (ii) multiple switches to pull the gate to ground and to disconnect the gate from the Vin signal, e.g., as shown in FIG. 4. Furthermore, the gate and source of the cascode transistor may be shorted via a switch, e.g., as shown in FIGS. 3 to 5. The protection circuitry may be implemented with switches, e.g., as shown in FIGS. 3, 4 and 5.

In general, an apparatus (e.g., an integrated circuit, a wireless device, etc.) may include an amplifier comprising multiple branches coupled in parallel and operative to amplify an input signal and provide an output signal. The amplifier may be a driver amplifier, a power amplifier, an LNA, a VGA, etc. The multiple branches may include at least one switchable branch. Each switchable branch may be operated in either an on state to increase an overall gain of the amplifier or an off state to decrease the overall gain.

In one exemplary design, each switchable branch may include a gain transistor coupled to a cascode transistor. The gain transistor may amplify the input signal and provide an amplified signal in the on state and may not amplify the input signal in the off state. The cascode transistor may buffer the amplified signal and provide the output signal in the on state. The voltage swing of the output signal may be split between the gain transistor and the cascode transistor in the on state as well as the off state. The gain transistor and the cascode transistor may each observe a fraction of the output voltage swing in the on and off states. The gain transistor and the cascode transistor may be implemented with NMOS transistors or some other types of transistors.

In one exemplary design, for each switchable branch, a switch (e.g., switch 320 in FIG. 3 or switch 420 in FIG. 4) may short the gate and source of the cascode transistor in the off state. In one exemplary design, a switch (e.g., switch 316 in FIG. 3) may be coupled between the source of the gain transistor and circuit ground and may be closed in the on state and opened in the off state. In another exemplary design, one switch (e.g., switch 418 in FIG. 4) may be coupled between the gate of the gain transistor and circuit ground and may be opened in the on state and closed in the off state. Another switch (e.g., switch 416 in FIG. 4) may be coupled between the gate of the gain transistor and the input signal and may be closed in the on state and opened in the off state.

In one exemplary design, each switchable branch may include a second cascode transistor coupled between the cascode transistor and the gain transistor, e.g., as shown in FIG. 5. The second cascode transistor may buffer the amplified signal in the on state. The voltage swing of the output signal may be split between the gain transistor and the two cascode transistors in both the and off states.

An inductor may be coupled between a supply voltage and the drain of the cascode transistor in each switchable branch. The output signal may have voltage swing below and above the supply voltage. A bias circuit may receive the output signal and provide a bias voltage for the cascode transistor in each switchable branch. The bias voltage may be applied to only the gate of the cascode transistor in the on state and to both the gate and source of the cascode transistor in the off state, e.g., as shown in FIGS. 3 and 4.

Figure 6:
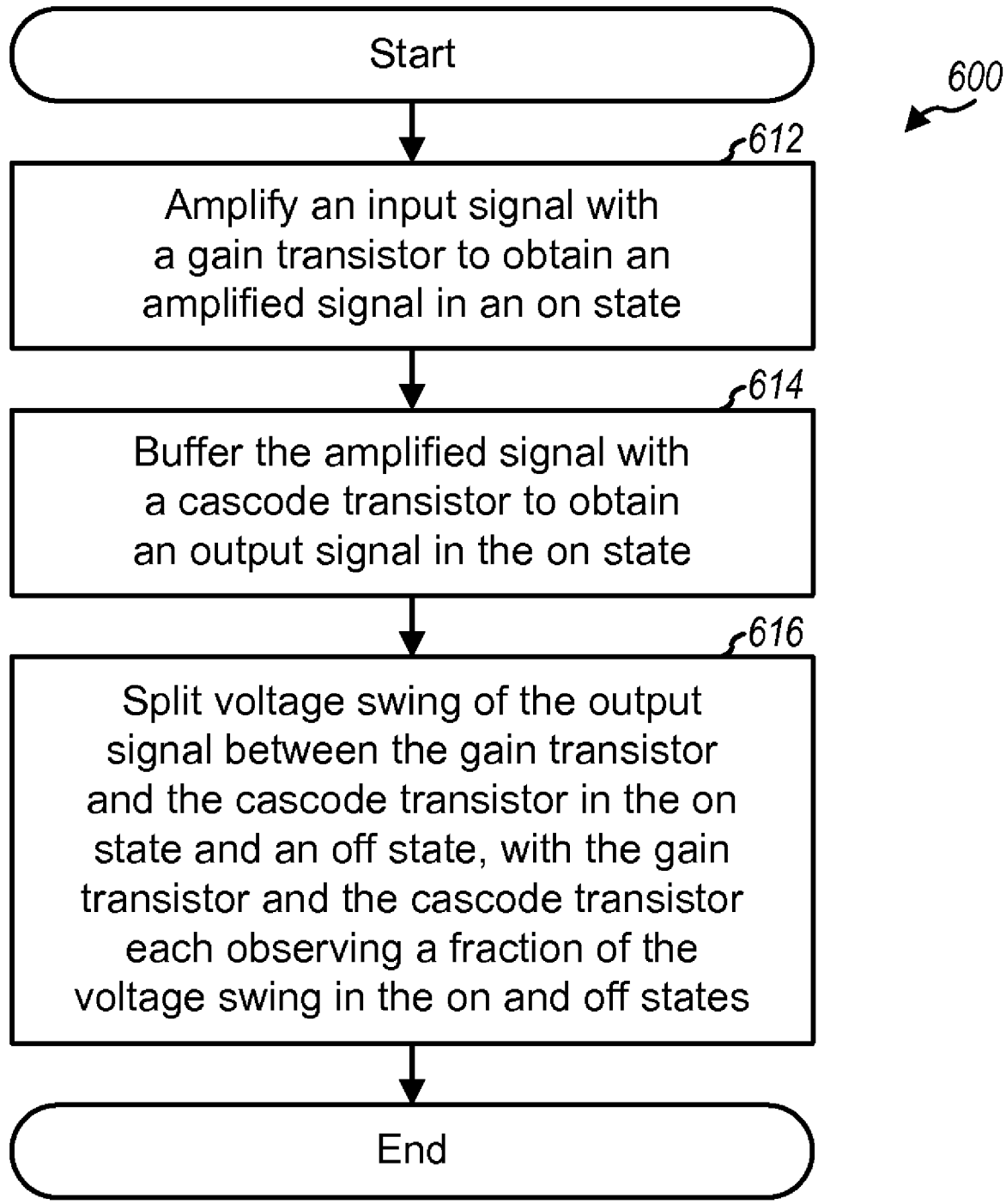
FIG. 6 shows a process for operating an amplifier.

FIG. 6 shows an exemplary design of a process 600 for operating an amplifier. An input signal may be amplified with a gain transistor to obtain an amplified signal in an on state (block 612). The amplified signal may be buffered with a cascode transistor to obtain an output signal in the on state (block 614). The amplifier may comprise multiple branches, and at least one branch may be enabled. Each enabled branch may comprise the gain transistor and the cascode transistor operating in the on state. A bias voltage may be generated based on the output signal and applied to the gate of the cascode transistor.

The voltage swing of the output signal may be split between the gain transistor and the cascode transistor in the on state and an off state, with the gain transistor and the cascode transistor each observing a fraction of the voltage swing in the on and off states (block 616). In one exemplary design of block 616, the gate and source of the cascode transistor may be shorted, and the source of the gain transistor may be decoupled from circuit ground in the off state, e.g., as shown in FIG. 3. In another exemplary design of block 616, the gate and source of the cascode transistor may be shorted, and the gate of the gain transistor may be decoupled from the input signal and further shorted to circuit ground in the off state, e.g., as shown in FIG. 4.

The cascode amplifier with protection circuitry described herein may be implemented on an IC, an analog IC, an RFIC, a mixed-signal IC, an ASIC, a printed circuit board (PCB), an electronics device, etc. The cascode amplifier may also be fabricated with various IC process technologies such as CMOS, NMOS, PMOS, bipolar junction transistor (BJT), bipolar-CMOS (BiCMOS), silicon germanium (SiGe), gallium arsenide (GaAs), etc.

An apparatus implementing the cascode amplifier described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   a gain transistor operative to amplify an input signal and provide an amplified signal in an on state and to not amplify the input signal in an off state;
   a cascode transistor coupled to the gain transistor and operative to buffer the amplified signal and provide an output signal in the on state, wherein voltage swing of the output signal is split between the gain transistor and the cascode transistor in the on state and the off state, with the gain transistor and the cascode transistor each observing a fraction of the voltage swing in the on the off states;
   a first switch operative to short a gate and a source of the cascode transistor in the off state; and
   a second switch coupled between a source of the gain transistor and circuit ground, the second switch being closed in the on state and opened in the off state.

2. The apparatus of claim 1, further comprising:
   a second cascode transistor coupled between the gain transistor and the cascode transistor and operative to buffer the amplified signal in the on state, wherein the voltage swing of the output signal is split between the gain transistor, the cascode transistor, and the second cascode transistor in the on and off states.

3. The apparatus of claim 1, further comprising:
   a bias circuit operative to receive the output signal and provide a bias voltage for the cascode transistor.

4. The apparatus of claim 3, wherein the bias voltage is applied to only a gate of the cascode transistor in the on state and to both the gate and source of the cascode transistor in the off state.

5. The apparatus of claim 3, wherein the bias circuit comprises:
   a resistor coupled between a drain and a gate of the cascode transistor; and
   a capacitor coupled between the gate of the cascode transistor and circuit ground.

6. The apparatus of claim 1, further comprising:
   an inductor coupled between a drain of the cascode transistor and a supply voltage, wherein the output signal has voltage swing below and above the supply voltage.

7. An apparatus comprising:
   a gain transistor operative to amplify an input signal and provide an amplified signal in an on state and to not amplify the input signal in an off state;
   a cascode transistor coupled to the gain transistor and operative to buffer the amplified signal and provide an output signal in the on state, wherein voltage swing of the output signal is split between the gain transistor and the cascode transistor in the on state and the off state, with the gain transistor and the cascode transistor each observing a fraction of the voltage swing in the on the off states;
   a first switch operative to short a gate and a source of the cascode transistor in the off state; and
   a second switch coupled between a gate of the gain transistor and circuit ground, the second switch being opened in the on state and closed in the off state; and
   a third switch coupled between the gate of the gain transistor and the input signal, the third switch being closed in the on state and opened in the off state.

8. The apparatus of claim 7, further comprising:
   a bias circuit operative to receive the output signal and provide a bias voltage for the cascode transistor.

9. The apparatus of claim 8, wherein the bias voltage is applied to only a gate of the cascode transistor in the on state and to both the gate and source of the cascode transistor in the off state.

10. The apparatus of claim 8, wherein the bias circuit comprises:
    a resistor coupled between a drain and a gate of the cascode transistor; and
    a capacitor coupled between the gate of the cascode transistor and circuit ground.

11. The apparatus of claim 7, further comprising:
    an inductor coupled between a drain of the cascode transistor and a supply voltage, wherein the output signal has voltage swing below and above the supply voltage.

12. A wireless device comprising:
    an amplifier comprising multiple branches coupled in parallel and operative to amplify an input signal and provide an output signal, the multiple branches comprising at least one switchable branch, each switchable branch being operable in an on state or an off state and comprising:
      a gain transistor operative to amplify the input signal and provide an amplified signal in the on state and to not amplify the input signal in the off state;
      a cascode transistor coupled to the gain transistor and operative to buffer the amplified signal and provide the output signal in the on state, wherein voltage swing of the output signal is split between the gain transistor and the cascode transistor in the on state and the off state;
      a first switch operative to short a gate and a source of the cascode transistor in the off state; and
      a second switch coupled between a source of the gain transistor and circuit ground, the second switch being closed in the on state and opened in the off state.

13. The wireless device of claim 12, wherein each of the at least one switchable branch is operated in the on state to increase an overall gain of the amplifier and operated in the off state to decrease the overall gain.

14. The wireless device of claim 12, further comprising:
    an inductor coupled between a supply voltage and a drain of the cascode transistor in each switchable branch, wherein the output signal has voltage swing below and above the supply voltage.

15. The wireless device of claim 12, further comprising:
    a bias circuit operative to receive the output signal and provide a bias voltage for the cascode transistor in each switchable branch.

16. The wireless device of claim 12, wherein the amplifier is a driver amplifier (DA), a power amplifier (PA), a low noise amplifier (LNA), or a variable gain amplifier (VGA).

17. The wireless device of claim 12, wherein each switchable branch further comprising:
 a second cascode transistor coupled between the gain transistor and the cascode transistor and operative to buffer the amplified signal in the on state, wherein the voltage swing of the output signal is split between the gain transistor, the cascode transistor, and the second cascode transistor in the on and off states.

18. A method comprising:
 amplifying an input signal with a gain transistor to obtain an amplified signal in an on state;
 buffering the amplified signal with a cascode transistor and providing an output signal in the on state;
 splitting voltage swing of the output signal between the gain transistor and the cascode transistor in the on state and an off state, with the gain transistor and the cascode transistor each observing a fraction of the voltage swing in the on and off states;
 shorting a gate and a source of the cascode transistor in the off state;
 coupling a source of the gain transistor to circuit ground in the on state; and
 decoupling the source of the gain transistor from circuit ground in the off state.

19. The method of claim 18, further comprising:
 generating a bias voltage based on the output signal; and
 applying the bias voltage to a gate of the cascode transistor.

20. The method of claim 18, further comprising:
 enabling at least one branch of an amplifier comprising multiple branches, each enabled branch comprising the gain transistor and the cascode transistor operating in the on state.

21. A method comprising:
 amplifying an input signal with a gain transistor to obtain an amplified signal in an on state;
 buffering the amplified signal with a cascode transistor and providing an output signal in the on state;
 splitting voltage swing of the output signal between the gain transistor and the cascode transistor in the on state and an off state, with the gain transistor and the cascode transistor each observing a fraction of the voltage swing in the on and off states;
 shorting a gate and a source of the cascode transistor in the off state;
 coupling the input signal to a gate of the gain transistor in the on state; and
 decoupling the input signal from the gate of the gain transistor and shorting the gate to circuit ground in the off state.

22. The method of claim 21, further comprising:
 generating a bias voltage based on the output signal; and
 applying the bias voltage to a gate of the cascode transistor.

23. The method of claim 21, further comprising:
 enabling at least one branch of an amplifier comprising multiple branches, each enabled branch comprising the gain transistor and the cascode transistor operating in the on state.

24. An apparatus comprising:
 means for amplifying an input signal to obtain an amplified signal in an on state;
 means for buffering the amplified signal and providing an output signal in the on state;
 means for splitting voltage swing of the output signal between the means for amplifying and the means for buffering in the on state and an off state, with the means for amplifying and the means for buffering each observing a fraction of the voltage swing in the on and off states;
 means for shorting a gate and a source of the means for buffering in the off state;
 means for coupling a source of the gain transistor to circuit ground in the on state; and
 means for decoupling the source of the gain transistor from circuit ground in the off state.

25. The apparatus of claim 24, further comprising:
 means for enabling the means for amplifying in the on state and disabling the means for amplifying in the off state.

26. The apparatus of claim 24, further comprising:
 means for biasing the means for buffering with at least one bias voltage in the off state.

27. The apparatus of claim 24, further comprising:
 means for enabling at least one branch of an amplifier comprising multiple branches, each enabled branch comprising the means for amplifying and the means for buffering operating in the on state.

28. A wireless device comprising:
 an amplifier comprising multiple branches coupled in parallel and operative to amplify an input signal and provide an output signal, the multiple branches comprising at least one switchable branch, each switchable branch being operable in an on state or an off state and comprising:
  a gain transistor operative to amplify the input signal and provide an amplified signal in the on state and to not amplify the input signal in the off state;
  a cascode transistor coupled to the gain transistor and operative to buffer the amplified signal and provide the output signal in the on state, wherein voltage swing of the output signal is split between the gain transistor and the cascode transistor in the on state and the off state;
  a first switch operative to short a gate and a source of the cascode transistor in the off state;
  a second switch coupled between a gate of the gain transistor and circuit ground, the second switch being opened in the on state and closed in the off state; and
  a third switch coupled between the gate of the gain transistor and the input signal, the third switch being closed in the on state and opened in the off state.

29. The wireless device of claim 28, wherein each of the at least one switchable branch is operated in the on state to increase an overall gain of the amplifier and operated in the off state to decrease the overall gain.

30. The wireless device of claim 28, further comprising:
 an inductor coupled between a supply voltage and a drain of the cascode transistor in each switchable branch, wherein the output signal has voltage swing below and above the supply voltage.

31. The wireless device of claim 28, further comprising:
 a bias circuit operative to receive the output signal and provide a bias voltage for the cascode transistor in each switchable branch.

32. The wireless device of claim 28, wherein the amplifier is a driver amplifier (DA), a power amplifier (PA), a low noise amplifier (LNA), or a variable gain amplifier (VGA).

33. An apparatus comprising:
 means for amplifying an input signal with a gain transistor to obtain an amplified signal in an on state;

means for buffering the amplified signal with a cascode transistor and providing an output signal in the on state;

means for splitting voltage swing of the output signal between the gain transistor and the cascode transistor in the on state and an off state, with the gain transistor and the cascode transistor each observing a fraction of the voltage swing in the on and off states;

means for shorting a gate and a source of the cascode transistor in the off state;

means for coupling the input signal to a gate of the gain transistor in the on state; and means for decoupling the input signal from the gate of the gain transistor and shorting the gate to circuit ground in the off state.

34. The apparatus of claim 33, further comprising:

means for enabling the means for amplifying in the on state and disabling the means for amplifying in the off state.

35. The apparatus of claim 33, further comprising:

means for biasing the means for buffering with at least one bias voltage in the off state.

36. The apparatus of claim 33, further comprising:

means for enabling at least one branch of an amplifier comprising multiple branches, each enabled branch comprising the means for amplifying and the means for buffering operating in the on state.

* * * * *